United States Patent [19]

Luz

[11] Patent Number: 4,647,823
[45] Date of Patent: Mar. 3, 1987

[54] POWER SWITCH CONTROL CIRCUIT FOR TELEVISION APPARATUS

[75] Inventor: David W. Luz, Indianapolis, Ind.

[73] Assignee: RCA Corporation, Princeton, N.J.

[21] Appl. No.: 741,795

[22] Filed: Jun. 6, 1985

[51] Int. Cl.$^4$ .............................................. H01J 29/70
[52] U.S. Cl. ................................... 315/411; 315/408; 358/190
[58] Field of Search ................. 315/411, 408; 358/190

[56] References Cited

U.S. PATENT DOCUMENTS

| | | |
|---|---|---|
| 3,174,073 | 3/1965 | Massman et al. . |
| 3,466,496 | 9/1969 | Geller et al. . |
| 3,512,040 | 5/1970 | Lester . |
| 4,335,334 | 6/1982 | Hosoya . |
| 4,390,819 | 6/1983 | Babcock et al. ........................ 315/411 |

FOREIGN PATENT DOCUMENTS

| | | |
|---|---|---|
| 1573828 | 8/1980 | United Kingdom . |
| 2082413A | 3/1982 | United Kingdom . |

OTHER PUBLICATIONS

U.S. Patent Appln. Ser. No. 677,522, entitled A Resonant Switching Apparatus Using A Cascode Arrangement in the name of W. F. W. Dietz.

Primary Examiner—Theodore M. Blum
Attorney, Agent, or Firm—Eugene M. Whitacre; Joseph J. Laks; Sammy S. Henig

[57] ABSTRACT

A television deflection apparatus includes a deflection winding coupled to a retrace capacitance to form a retrace resonant circuit. A power transistor switch is coupled to the retrace resonant circuit for generating alternating current in the retrace resonant circuit. The power transistor switch energizes a primary winding of a flyback transformer that supplies a first voltage across a secondary winding of the flyback transformer. The first voltage is coupled to an inductance for forming an upramping current in the inductance. The upramping current in the inductance is coupled to the base electrode of the power transistor switch, causing the power transistor switch to be conductive during the second half of trace. A second switch, that is responsive to a deflection rate input signal, couples to the base electrode of the power transistor switch a negative supply voltage that turns off the power transistor to initiate the retrace interval.

18 Claims, 7 Drawing Figures

POWER SWITCH CONTROL CIRCUIT FOR TELEVISION APPARATUS

This invention relates to a deflection scanning or power switching circuit.

Generally, a horizontal scanning circuit applies the pulse signal delivered from a horizontal oscillation circuit to the base, or control electrode of a horizontal power transistor that operates as a switch. The collector of the horizontal power transistor is connected in series to the primary winding of a flyback transformer. The turning on and off of the horizontal power transistor in response to the pulse signal from the horizontal oscillation circuit causes a scanning current flow into a horizontal deflection winding.

Usually, the base electrode current required to excite the horizontal power transistor is relatively large; therefore, in some prior art circuits, the output signal from horizontal oscillation circuit, that is required to provide the base electrode current drive, has to provide substantial power. Such base electrode driving circuits consume, generally, a substantial amount of power and they are bulky. Such bulky construction poses a significant hurdle for the miniaturization of a television set or reduction of manufacturing cost.

In accordance with an aspect of the invention, the base or control electrode driving current, that causes the power transistor switch to be conductive, is obtained from a feedback current produced by the power transistor switch itself. Thus, the circuit of the invention does not require a bulky driving circuit. In particular, the circuit of the invention obtains the base electrode turn-on driving current from an additional winding of a flyback transformer. The other flyback transformer windings may perform similar functions as in other prior art circuits. Therefore, the added cost and increased volume associated with incorporating this additional winding are relatively small.

In some prior art circuits, the base electrode current drive waveform is generally flat, downramping, or downward drooping, during the collector-to-emitter conduction period of the power transistor. Since the collector-to-emitter current is mainly an upramping current during the power transistor conduction time, the base electrode current in such circuits substantially exceeds, at least in the beginning of the conduction time, what is required for sustaining the upramping collector-to-emitter current. This excessive base electrode current causes undesirable power dissipation in such prior art circuits.

In accordance with another aspect of the invention, the base electrode current drive of the power transistor that causes the power transistor switch to be conductive is an unramping current that sustains the corresponding upramping collector-to-emitter current. Thus, the power supplied by the base electrode current driving circuit may be, advantageously, lower than in some prior art circuits. Furthermore, in the circuit of the invention the base electrode current is substantially a reactive current as it is formed in an inductance that is in series with the base-emitter junction. Therefore, the power dissipation caused by such reactive current is relatively small.

Another problem that some prior art circuits suffer from is a slow turn-off time of the power transistor. This slow turn-off time occurs in such circuits because the charge in the base electrode region of the power transistor is not discharged fast enough. When the turn-off time is slow, the maximum scanning frequency of such deflection circuit is reduced. With the advent of requirements for higher deflection frequencies, such as in a double frequency scanning format, this upper frequency limitation reduces the usefulness of such prior art deflection circuits in high frequency deflection applications.

Therefore, in accordance with yet another aspect of the invention, the base electrode potential is actively pulled down by a second switching device that substantially couples a voltage source across the base-emitter junction of the power transistor switch. This pull-down voltage source causes the charge in the base electrode region to be discharged quickly. The pull-down voltage is coupled to the base electrode in response to an input signal of the horizontal oscillation circuit that controls the second switching device. Thus, the circuit of the invention is capable of operating at high switching frequencies.

In accordance with a further aspect of the invention, the pull-down voltage provides an added advantage in that it increases the peak voltage that the collector-to-base junction can tolerate without junction breakdown. This is so because the breakdown voltage of the power transistor increases when the base-emitter voltage is sufficiently negative when the power transistor is nonconductive. Thus, the reliability and versatility of the circuit is superior relative to some prior art circuit in which the base-emitter junction is not back-biased by such pull-down voltage.

Some prior art circuits include dedicated components for starting-up the operation of the circuit. In accordance with an aspect of the invention, the switched pull-down voltage that is coupled to the upramping current generating inductance also guarantees start-up, such as during power turn-on. Thus, start-up is achieved without the need for additional dedicated components.

In accordance with yet a further aspect of the invention, a power transistor switch switches an output current in an inductive load. A control switch responsive to a periodic input signal couples a source of reverse biasing voltage, during a first interval of a given period of the input signal, to turn off the power transistor switch. The reverse biasing voltage is applied to an inductance to generate an inductive current in the inductance that is coupled to the base electrode of the power transistor switch. During a second interval of the given period, the control switch decouples the reverse biasing voltage from the base and enables the inductive current to flow into the base to turn on the power transistor switch.

Figure 1:
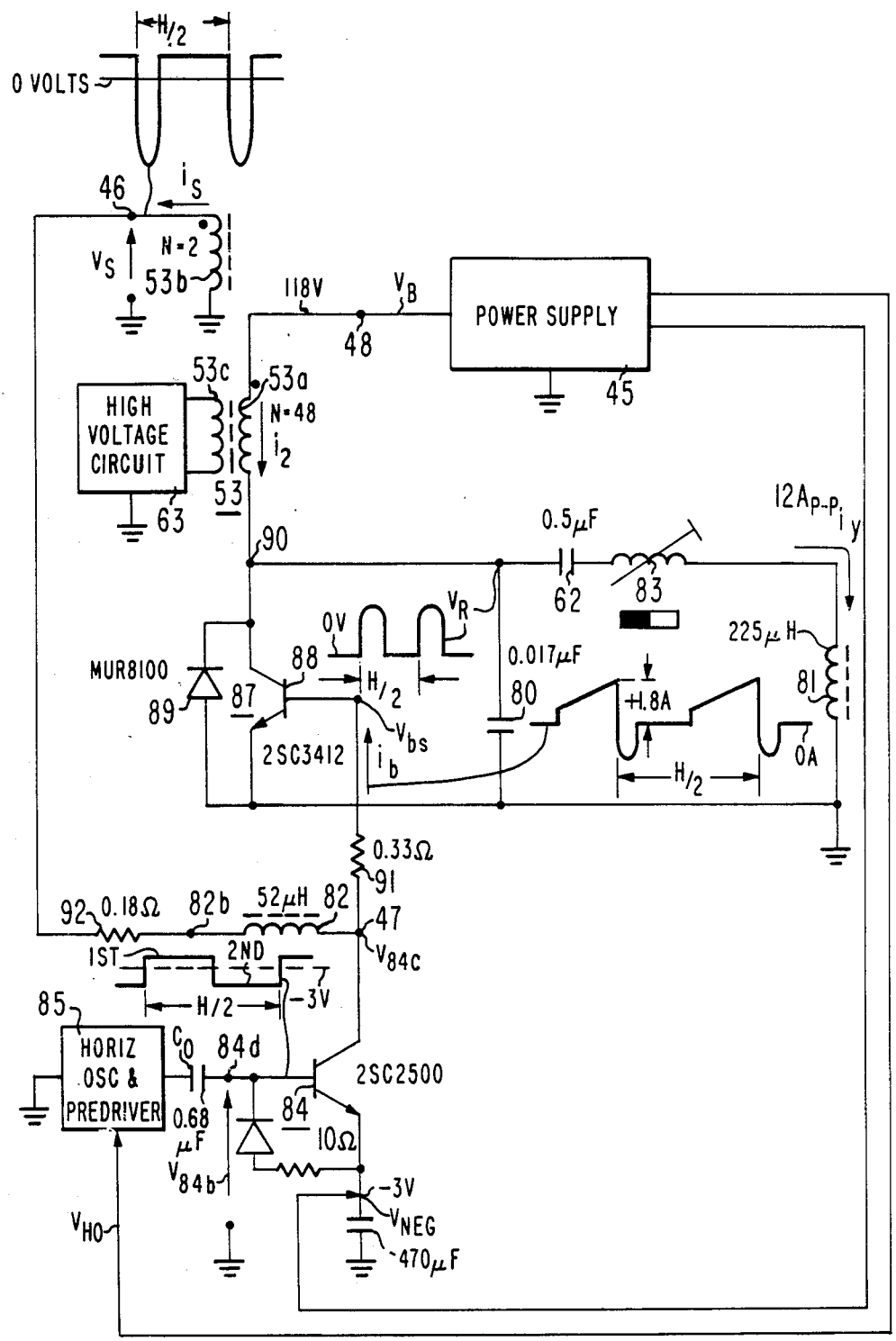
FIG. 1 illustrates a deflection circuit embodying the invention.

In a deflection circuit 200, illustrated in the FIG. 1 that may be used in double frequency scanning format television system, a filtered DC voltage $V_B$ at a terminal 48 is supplied by a power supply 45 that is separate from circuit 200 and that may be of the switched mode type. Terminal 48 is coupled through primary winding 53a of a horizontal output or flyback transformer 53 to a terminal 90 of horizontal deflection circuit 200. A horizontal deflection winding 81 is coupled to horizontal deflection generator 86 for generating scanning current $i_y$ in deflection winding 81. Generator 86 comprises a linearity inductor 83 in series with a trace capacitor 62 and in series with a parallel arrangement of a retrace capacitor 80, and a trace switch 87. Trace switch 87 includes the parallel arrangement of a horizontal output power transistor 88 and a damper diode 89.

A high voltage winding 53c of flyback transformer 53 is coupled to a conventional high voltage circuit 63 for developing an ultor accelerating potential.

A synchronized horizontal oscillator and predriver circuit 85, that is energized by a voltage $V_{HO}$ of power supply 45, provides through a capacitor $C_0$ a switching control signal voltage $V_{84b}$, that appears as a square wave superimposed on a negative direct current voltage, to the control base electrode of a transistor switch 84. The period of voltage $V_{84b}$ is H/2, where H/2 represents one line scan interval in a $2f_H$ deflection system. Note that H is the conventional horizontal period of e.g. 63.5 microseconds.

When voltage $V_{84b}$ forward-biases the base-emitter junction of transistor switch 84, in accordance with a first level of the superimposed square wave, transistor switch 84 is conductive; conversely, when voltage $V_{84b}$ back-biases the base-emitter junction, in accordance with the other, or second, level of the superimposed square wave, transistor switch 84 is non-conductive. The emitter electrode of transistor switch 84 is coupled to a negative pull-down voltage source $V_{NEG}$. The collector electrode of transistor switch 84 is coupled through a current limiting resistor 91 to the base electrode of horizontal output power transistor 88. A terminal 46 of a secondary winding 53b of flyback transformer 53 is coupled through a current limiting resistor 92 to a terminal 82b of an inductor 82. A terminal 47, the other end terminal of inductor 82, is coupled at the junction between resistor 91 and the collector electrode of transistor switch 84.

In normal operation, deflection switch 87 is closed during the trace interval. When deflection switch 87 is closed, it isolates transformer 53 from deflection winding 81. An upramping primary current $i_2$ in primary winding 53a increases the energy stored in flyback transformer 53 during the trace interval. This stored energy replenishes losses in deflection circuit 86 and energizes high voltage circuit 63 when switch 87 is opened during the retrace interval. Deflection winding 81 forms with transformer 53, and with retrace capacitor 80 a retrace resonant circuit. The energy stored in transformer 53 and deflection winding 81, during the trace interval, is transferred into retrace capacitor 80 to produce a retrace voltage $V_R$ across capacitor 80, during the retrace interval, that is illustrated in FIG. 2c.

The voltage across primary winding 53a of FIG. 1 is coupled by a transformer action to secondary winding 53b for developing a voltage $V_S$ at terminal 46. During the trace interval, voltage $V_S$ is positive. During the retrace interval, voltage $V_S$ is negative. Negative voltage $V_S$ occurs when retrace voltage $V_R$ at terminal 90 is more positive than voltage $V_B$ at terminal 48.

Figure 2:
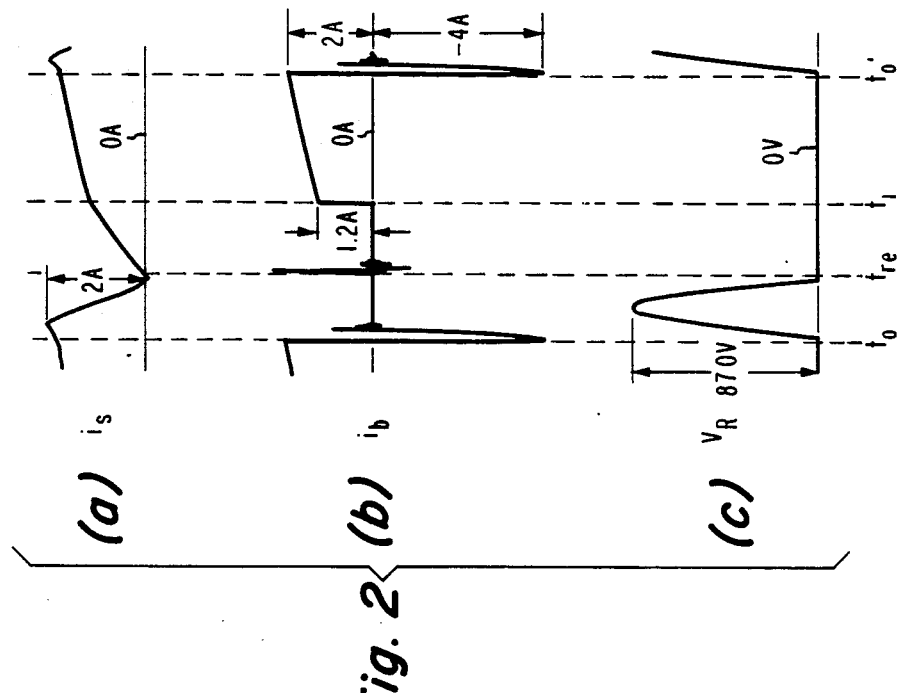
FIGS. 2a–2c illustrate waveforms useful in explaining the normal operation of the circuit of FIG. 1.

Positive voltage $V_S$, across secondary winding 53b, causes the flow of an upramping current $i_s$ in inductor 82, as illustrated in FIG. 2a, from time $t_{re}$, at the end of retrace, to time $t_0'$, at the end of trace.

During a first portion of trace, transistor switch 84 of FIG. 1 is conductive, in accordance with the occurrence of the first level of the waveform of voltage $V_{84b}$. Therefore, voltage $V_{84c}$ at terminal 47 of inductor 82 is negative and substantially equal to voltage $V_{NEG}$. During the first portion of trace, from time $t_{re}$ to time $t_1$ of FIG. 2a, power transistor 88 of FIG. 1 is non-conductive because voltage $V_{84c}$, that is coupled to its base electrode, is negative. Negative voltage $V_{84c}$ causes the rate of increase of current $i_s$ of FIG. 2a to be higher during the interval $t_{re}$–$t_1$. Simultaneously, deflection current $i_y$ of FIG. 1 flows through damper diode 89.

Prior to the center of the trace interval, voltage $V_{84b}$ at the base electrode of transistor switch 84 becomes more negative when the transition from the first to the second level of the superimposed square wave occur, causing transistor switch 84 to be non-conductive. When transistor switch 84 is non-conductive, current $i_s$ flows entirely to the base electrode of power transistor 88 in the form of base electrode current $i_b$, thus causing the conduction, or turn-on, of power transistor 88. Afterward, during the rest of trace, current $i_b$, or $i_s$, as illustrated in FIG. 2b or 2a, respectively, between times $t_1$ and $t_0'$, continues to ramp up because of positive voltage $V_S$ of FIG. 1 at terminal 46 of secondary winding 53b.

In accordance with an aspect of the invention, upramping current $i_b$ of FIG. 2b provides the base electrode drive for sustaining the corresponding upramping current in the collector electrode of power transistor 88 of FIG. 1.

Near the end of trace interval, voltage $V_{84b}$ at the base electrode of transistor 84 becomes more positive, causing transistor switch 84 to close, or to become conductive. The closing of transistor switch 84 couples voltage $V_{NEG}$, that is generated by power supply 45, to junction terminal 47 for producing voltage $V_{84c}$ that is negative. Negative voltage, $V_{84c}$ at junction terminal 47 produces a negative base electrode current $i_b$ in power transistor 88, having a peak of −4A as illustrated in FIG. 2b, resulting in a fast turn-off of power transistor 88 of FIG. 1 to initiate, thereby, the retrace interval. Thus, current $i_b$ rapidly sweeps out the charge from the base electrode, to render power transistor 88 non-conductive. When switch 84 is conductive it shunts current $i_s$ away from the base electrode of power transistor 88. Retrace voltage $V_R$ across capacitor 80 is developed when power transistor 88 becomes non-conductive. Voltage $V_{84c}$ has a negative average direct current voltage component. Resistor 92 limits the direct current component of current $i_s$ that is caused by voltage $V_{84c}$.

Prior to the beginning time of a start-up interval, none of transformer 53, winding 81 and capacitors 62 and 80 is energized. Assume, illustratively, that prior to the start-up interval beginning time, voltages $V_{HO}$ and $V_{NEG}$ of power supply 45 are at their respective normal operating levels and that voltage $V_{84b}$ has the normal operating waveform; whereas voltage $V_B$ is turned on at the start-up interval beginning time. At the start-up interval beginning time, there is no voltage $V_S$ available across flyback transformer winding 53b for generating positive current $i_b$ to switch on power transistor 88 at the initiation of start-up.

In accordance with another aspect of the invention, during the start-up interval, current $i_s$ is generated in inductor 82 by the switching operation of transistor switch 84 that couples voltage $V_{NEG}$ to terminal 47. During the start-up interval, when transistor switch 84 is conductive, voltage $V_{84c}$ is negative, in accordance with the occurrence of the first level of the square wave voltage $V_{84b}$. The voltage at terminal 82b is more positive than that at terminal 84c cause terminal 82b is coupled to ground potential through winding 53b. Furthermore, at start-up, no voltage is being developed across winding 53b. Therefore, inductive current $i_s$ in inductor 82 flows into junction terminal 47 in an upramping manner during start-up when transistor 84 is conductive. Upramping current $i_s$ stores inductive energy in inductor 82.

Figure 3:
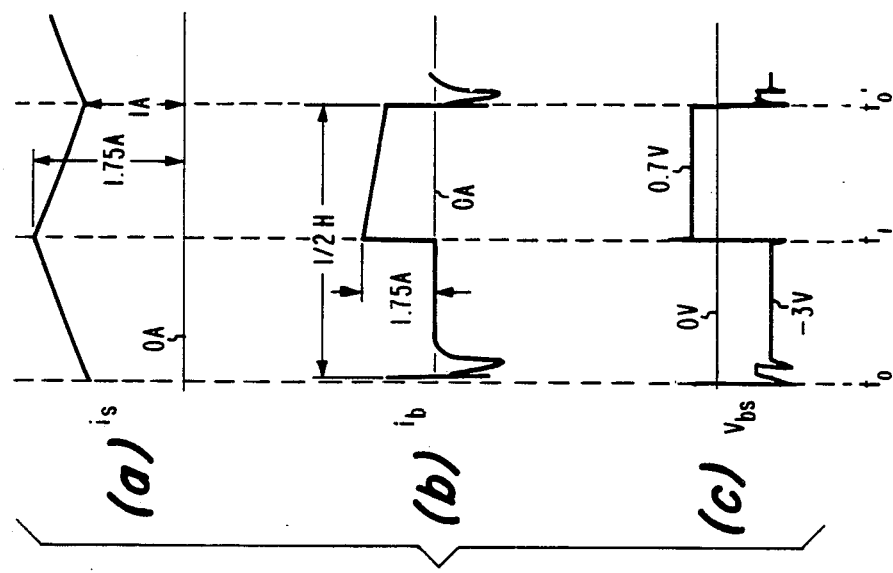
FIGS. 3a–3c illustrate waveforms useful in explaining the start-up operation of the circuit of FIG. 1.

FIGS. 3a–3c illustrate waveforms obtained when only voltage $V_B$ of power supply 45 is zero so as to simulate the beginning of the start-up operation. The other voltages of power supply 45 are at the normal levels, respectively. Similar numerals and symbols in FIGS. 1, 2a–2c and 3a–3c indicate similar items or functions.

As illustrated in FIG. 3a, between times $t_0$ and $t_1$, the interval when transistor 84 is conductive, current $i_s$ is upramping. When transistor switch 84 of FIG. 1 becomes non-conductive, in accordance with the occurrence of the second level of the square wave voltage $V_{84b}$, current $i_s$ that results from the stored magnetic energy in inductor 82 is a downramping current that is diverted to the base electrode of power transistor 88 to form positive base electrode current $i_b$, as illustrated in FIG. 3b between times $t_1$ and $t_0'$. Positive base electrode current $i_b$ of FIG. 3b causes power transistor 88 of FIG. 1 to be conductive by developing a positive base voltage $V_{bs}$ of FIGS. 1 and 3c between times $t_1$ and $t_0'$. When voltage $V_B$ begins to be developed, after the initiation of start-up, alternating periods of conduction and non-conduction of power transistor 88 of FIG. 1 initiate normal deflection circuit switching operation, thereby generating deflection rate voltage $V_s$. After voltage $V_S$ is generated, the normal switching drive to horizontal output transistor 88, illustrated in FIG. 2b, can take place.

It should be understood that an arrangement similar to that of deflection circuit 200 of FIG. 1 in which deflection winding 81 is replaced by an inductor may be used as part of a switching power supply that generates output voltages from an arrangement similar to high voltage circuit 63. The operating frequency of the switching power supply power transistor may be the deflection frequency or a multiple thereof.

What is claimed is:

1. A television apparatus for generating an output current at an input rate that is equal to a deflection rate or a multiple thereof, comprising:
   a power switch having a control electrode and a pair of current conducting electrodes;
   a source of an input signal at said input rate;
   means responsive to said input signal and coupled to said control electrode for supplying, during a first interval of a given period of said input signal, a first control current that is coupled to said control electrode and that causes said switch to be nonconductive at said input rate;
   a resonant circuit coupled to said pair of current conducting electrodes for generating said output current that is switched at said input rate by said switch and for generating a voltage at said input rate;
   an inductance having a first terminal that is coupled to said control electrode; and
   means responsive to said voltage that is generated by said resonant circuit for generating an alternating current first voltage that is coupled to a second terminal of said inductance and having a first polarity that generates in said inductance, as long as said first voltage is at said first polarity, a progressively increasing second control current that is coupled to said control electrode to cause said switch to be conductive outside said first interval, said second control current being shunted away from said control electrode by said first control current supplying means during said first interval and continues flowing in said inductance after an end time of said first interval in the same direction as prior to said end time to cause said switch to become conductive, said second control current in said inductance decreasing when said first voltage is at the opposite polarity.

2. A television apparatus as recited in claim 1, wherein said second control current generating means comprises a transformer coupled to said pair of current conducting electrodes for generating at a first terminal of said transformer said first voltage at said input rate that is at said first polarity when said switch is conductive, wherein said inductance is coupled to said first terminal of said transformer and to said control electrode, and wherein said first polarity of said first voltage causes a current, that is upramping, to flow in said control electrode.

3. A television apparatus as recited in claim 2 wherein said first terminal of said transformer is coupled to said resonant circuit for generating at said first terminal of said transformer said polarity of said first voltage that is opposite to said first polarity that causes the current in said inductance to be downramping.

4. A television apparatus according to claim 2, wherein said first control current generating means comprises a second switch responsive to said input signal and operating at said input rate, wherein said second switch is coupled to a junction between said control electrode and said inductance for shunting the current in said inductance away from said control electrode when said second switch is conductive.

5. A television apparatus as recited in claim 2 wherein said first control current generating means comprises a second switch that is responsive to said input signal and that operates at said input rate, wherein said second switch is coupled to said first terminal of said inductance at a junction between said inductance and said control electrode, and wherein said second switch generates a current in said inductance that continues to flow in said control electrode when said second switch becomes nonconductive to provide said second control current therefrom.

6. A television apparatus as recited in claim 2 wherein said resonant circuit comprises a deflection winding and a retrace capacitance of a horizontal deflection circuit.

7. A television apparatus as recited in claim 1 wherein said first control current supplying means comprises a second switch that is responsive to said input signal and a source of supply voltage that is coupled to said control electrode at said input rate by said second switch to supply said first control current therefrom.

8. A television apparatus as recited in claim 1 wherein said second control current generating means comprises an inductance having a terminal that is coupled to said voltage that is generated at said one of said pair of current conducting electrodes of said switch, wherein said first control current generating means comprises a source of supply voltage and a second switch that is responsive to said input signal and that operates at said input rate, wherein said second switch, when conductive, couples said source of supply voltage to said first terminal of said inductance to produce an inductive current, and wherein said inductive current flows in said control electrode after said second switch becomes nonconductive to generate said second control current therefrom.

9. A television apparatus as recited in claim 1 wherein said resonant circuit includes a second inductance, said second inductance generating a switch current that flows in a first direction between said pair of current conducting electrodes of said switch during a portion of each period of said input signal, wherein said switch current is of a progressively increasing magnitude during substantially the entire interval that occurs when said switch conducts said switch current in said first direction.

10. A television apparatus as recited in claim 1 wherein said first control current generating means comprises a source of supply voltage and a second switch that operates at said input rate, in accordance with said input signal, wherein said second switch, when conductive, couples said source of supply voltage to said first terminal of said inductance to produce, from the respective voltages at said terminals of said inductance, an inductive current, that flows in said control electrode after said second switch becomes nonconductive, to generate said second control current therefrom, wherein during start-up beginning time, said inductive current is produced only from the voltage at said first terminal of said inductance.

11. A television apparatus according to claim 1, wherein said first control current supplying means comprises a second switch responsive to said input signal and operating at said input rate, wherein said second switch couples a supply voltage to said control electrode for rapidly sweeping out charge from said control electrode to render said power switch nonconductive.

12. A television deflection apparatus for generating, in accordance with an input voltage at a deflection rate, a deflection current in a deflection winding, comprising:
a deflection winding;
a deflection switch having a control electrode and a pair of current conducting electrodes, and coupled to said deflection winding for generating therein a trace current of a deflection current when said switch is conductive during a trace interval;
a retrace capacitance coupled to said deflection winding to form a retrace resonant circuit during each retrace interval;
a flyback transformer winding coupled to said switch and responsive to the voltage across said retrace capacitance for generating a deflection rate first voltage at a first polarity during said retrace interval and at an opposite polarity during said trace interval;
an inductance coupled to said first voltage for generating a first control current in said inductance that is coupled to said control electrode during a portion of each trace interval to cause said switch to be conductive, wherein said first polarity of said first voltage causes said first control current to be progressively increasing throughout said trace interval and wherein said opposite polarity of said first voltage causes said first control current to decrease during said retrace interval; and
means coupled to said control electrode and responsive to said input voltage at said deflection rate for generating a deflection rate second control current in said control electrode that causes said switch to be nonconductive.

13. A television apparatus as recited in claim 12 wherein said trace current flows in said current conducting electrodes of said switch in an upramping manner that corresponds with said first control current.

14. A television switching apparatus for generating an output current in a power switch, comprising:
a power switch having a control electrode and a pair of current conducting electrodes;
a source of an input signal periodic at a switching rate;
means responsive to said input signal for supplying, during both a start-up time and a following normal operation time, a first control current to said control electrode to cause said switch to be nonconductive between said current conducting electrodes during a first interval of each period of said input signal;
an impedance coupled to said control electrode; and
a resonant circuit coupled to said pair of current conducting electrodes and to said impedance for generating said output current periodic at said switching rate and for generating during said normal operation time an output voltage periodic at said switching rate that is applied to said impedance for supplying a second control current to said control electrode to cause said switch to be conductive between said current conducting electrodes during a second interval of each period of said input signal, wherein during said start-up time said first control current stores energy in said impedance in said first interval for supplying said second control current in said second interval to initiate the generation of said output voltage.

15. An apparatus as recited in claim 14 wherein said impedance comprises an inductance.

16. An apparatus as recited in claim 14 wherein said first control current supplying means comprises a source of a supply voltage and a second switch responsive to said input signal for coupling said supply voltage to said impedance during both the start-up and normal operation times.

17. An apparatus as recited in claim 14 wherein the stored energy in said impedance also supplies said second control current during said normal operation time.

18. A television switching apparatus for switching an output current comprising:
an inductive load circuit;
a power transistor switch for switching said output current in said inductive load;
a source of an input signal at an input rate;
a control circuit for operating said switch at said input rate, said control circuit comprising:
a source of reverse biasing voltage;
a control switch coupled to said source and to the base of said power transistor switch;
an inductance coupled to said control switch, said control switch being responsive to said input signal for coupling said reverse biasing voltage to said power transistor switch during a first interval of a given period of said input signal to turn off said power transistor switch, said reverse biasing voltage being applied to said inductance to generated inductive current therein during said first interval, wherein said control switch decouples said reverse biasing voltage from said power transistor switch and enables said inductive current to flow in said inductance in the same direction after said reverse biasing voltage is decoupled and into the base of said power transistor switch that turns on said power transistor after said first interval during a second interval of said given period.

* * * * *